(12) United States Patent
Link et al.

(10) Patent No.: US 9,214,920 B2
(45) Date of Patent: Dec. 15, 2015

(54) ANTENNA MATCHING CIRCUIT

(75) Inventors: Andreas Link, Munich (DE); Stephan Marksteiner, Neubiberg (DE)

(73) Assignee: EPCOS AG, Munich (DE)

( * ) Notice: Subject to any disclaimer, the term of this patent is extended or adjusted under 35 U.S.C. 154(b) by 0 days.

(21) Appl. No.: 13/024,943

(22) Filed: Feb. 10, 2011

(65) Prior Publication Data

US 2011/0187478 A1    Aug. 4, 2011

Related U.S. Application Data

(63) Continuation of application No. PCT/EP2009/060839, filed on Aug. 21, 2009.

(30) Foreign Application Priority Data

Sep. 1, 2008 (DE) .......................... 10 2008 045 346

(51) Int. Cl.
*H03H 9/72* (2006.01)
*H03H 9/70* (2006.01)
*H03H 7/38* (2006.01)
*H03H 9/54* (2006.01)
*H03H 9/60* (2006.01)
*H03H 9/64* (2006.01)
*H01Q 1/50* (2006.01)

(52) U.S. Cl.
CPC ................. *H03H 9/706* (2013.01); *H01Q 1/50* (2013.01); *H03H 7/38* (2013.01); *H03H 9/547* (2013.01); *H03H 9/605* (2013.01); *H03H 9/6409* (2013.01); *H03H 9/6483* (2013.01); *H03H 9/725* (2013.01)

(58) Field of Classification Search
CPC . H03H 9/0004; H03H 9/0009; H03H 9/0014; H03H 11/16; H03H 11/18; H03H 11/20; H03H 11/28; H01P 5/12
USPC ......... 333/133, 187, 193, 4, 5, 124, 126, 129, 333/32, 33
See application file for complete search history.

(56) References Cited

U.S. PATENT DOCUMENTS 4,599,587 A * 7/1986 Hartmann et al. ............ 333/176
4,910,481 A   3/1990 Sasaki et al.
(Continued)

FOREIGN PATENT DOCUMENTS

DE    10 2004 053 319 A1    5/2006
DE    10 2005 028 927 A1    12/2006
(Continued)

OTHER PUBLICATIONS

Maxim Integrated Products, "Impedance Matching and the Smith Chart: The Fundamentals", Jul. 2002, Maxim Integrated Products.*
(Continued)

*Primary Examiner* — Robert Pascal
*Assistant Examiner* — Gerald Stevens
(74) *Attorney, Agent, or Firm* — Slater & Matsil, L.L.P.

(57) ABSTRACT

An antenna matching circuit includes at least two signal paths are connected to one antenna connection. The signal paths are designed to transmit and/or receive RF signals. A matching circuit includes a discrete line for phase shifting integrated at the antenna end in at least one of the signal paths. In this case, at least one of the capacitances contained in the discrete line is in the form of a micro-acoustic resonator, whose resonance is shifted sufficiently far that it is outside the pass band of the respective signal paths.

21 Claims, 7 Drawing Sheets

(56) References Cited

U.S. PATENT DOCUMENTS

| | | | |
|---|---|---|---|
| 6,140,891 A | 10/2000 | Nakakubo et al. | |
| 6,166,611 A * | 12/2000 | Seki et al. | 333/193 |
| 6,262,637 B1 | 7/2001 | Bradley et al. | |
| 6,351,197 B1 * | 2/2002 | Selmeier et al. | 333/195 |
| 6,489,861 B2 | 12/2002 | Noguchi et al. | |
| 6,717,487 B2 | 4/2004 | Takata | |
| 6,879,224 B2 | 4/2005 | Frank | |
| 7,042,311 B1 * | 5/2006 | Hilliker et al. | 333/133 |
| 7,230,510 B2 | 6/2007 | Lobeek | |
| 7,324,493 B2 * | 1/2008 | Yamada et al. | 370/342 |
| 7,339,445 B2 | 3/2008 | Aigner et al. | |
| 7,365,619 B2 | 4/2008 | Aigner et al. | |
| 7,579,926 B2 | 8/2009 | Jhung | |
| 7,579,927 B2 | 8/2009 | Iwamoto et al. | |
| 7,583,936 B2 | 9/2009 | Kovacs et al. | |
| 7,649,304 B2 | 1/2010 | Umeda et al. | |
| 7,683,736 B2 | 3/2010 | Inoue et al. | |
| 7,688,161 B2 | 3/2010 | Miura et al. | |
| 7,733,197 B2 | 6/2010 | Itou | |
| 7,915,975 B2 | 3/2011 | Bauer et al. | |
| 8,063,717 B2 | 11/2011 | Bradley et al. | |
| 8,076,999 B2 | 12/2011 | Schmidhammer | |
| 2002/0140520 A1 * | 10/2002 | Hikita et al. | 333/133 |
| 2003/0062969 A1 * | 4/2003 | Inoue | 333/193 |
| 2003/0227357 A1 | 12/2003 | Metzger et al. | |
| 2005/0174192 A1 | 8/2005 | Kawamura | |
| 2006/0091977 A1 * | 5/2006 | Inoue et al. | 333/133 |
| 2006/0158281 A1 * | 7/2006 | Garris et al. | 333/133 |
| 2006/0229030 A1 | 10/2006 | Simon et al. | |
| 2006/0232362 A1 | 10/2006 | Frank | |
| 2007/0046394 A1 * | 3/2007 | Inoue et al. | 333/133 |
| 2007/0149146 A1 | 6/2007 | Hwang et al. | |
| 2007/0191055 A1 | 8/2007 | Kovacs et al. | |
| 2008/0116993 A1 | 5/2008 | Yamakawa et al. | |
| 2008/0136555 A1 | 6/2008 | Schmidhammer | |
| 2008/0180193 A1 | 7/2008 | Iwasaki et al. | |
| 2008/0197941 A1 * | 8/2008 | Suzuki et al. | 333/189 |
| 2008/0238567 A1 | 10/2008 | Rosetti et al. | |
| 2008/0258983 A1 | 10/2008 | Bauer et al. | |
| 2008/0258989 A1 | 10/2008 | Rao et al. | |
| 2009/0167459 A1 | 7/2009 | Jakob et al. | |
| 2009/0309677 A1 | 12/2009 | Schmidhammer | |
| 2011/0248795 A1 * | 10/2011 | Beaudin et al. | 333/133 |
| 2011/0316649 A1 | 12/2011 | Link et al. | |

FOREIGN PATENT DOCUMENTS

| | | |
|---|---|---|
| DE | 10 2005 043 373 A1 | 3/2007 |
| DE | 10 2005 051 852 A1 | 5/2007 |
| DE | 10 2006 005 298 A1 | 8/2007 |
| DE | 10 2009 011 639 A1 | 9/2010 |
| EP | 1 265 312 A2 | 12/2002 |
| EP | 1 798 807 A1 | 6/2007 |
| JP | 06061783 A * | 3/1994 |
| JP | 06152299 A | 5/1994 |
| JP | 0998046 A | 4/1997 |
| JP | 09232909 A | 9/1997 |
| JP | 2000059174 A | 2/2000 |
| JP | 2001068965 A | 3/2001 |
| JP | 2001313542 A | 11/2001 |
| JP | 2003283363 A | 10/2003 |
| JP | 2004104799 A | 4/2004 |
| JP | 2005160056 A | 6/2005 |
| JP | 200661783 A | 3/2006 |
| JP | 2006180192 A | 7/2006 |
| JP | 2007036856 A | 2/2007 |
| JP | 2008109413 A | 5/2008 |
| JP | 2008160562 A | 7/2008 |
| WO | WO 2004/047290 A1 | 6/2004 |
| WO | 2004075402 A1 | 9/2004 |
| WO | WO 2005/053172 A1 | 6/2005 |
| WO | 2006040927 A1 | 4/2006 |
| WO | 2006121551 A1 | 11/2006 |
| WO | WO 2006/133807 A1 | 12/2006 |
| WO | WO 2007/119556 A1 | 10/2007 |
| WO | 2008067793 A1 | 6/2008 |

OTHER PUBLICATIONS

Hikita, M., et al., "1.5 SAW Miniature Antenna Duplexer Used in Personal Digital Cellular," Special Issue on Microwave Devices for Mobile Communications, IEICE Transactions and Electronics, May 1996, pp. 664-670, vol. E79-C, No. 5.

Beaudin, S., et al., "A New SAW Band Reject Filter and its Applications in Wireless Systems," 2002 IEEE Ultrasonics Symposium, XP001204393, Nov. 8, 2002, pp. 147-151, vol. 1.

Jian, C.-Y., et al., "SAW Band Reject Filter Performance at 850 MHz," 2005 IEEE Ultrasonics Symposium, Sep. 2005, pp. 2162-2165, vol. 4, Rotterdam, NL.

* cited by examiner

Fig 1
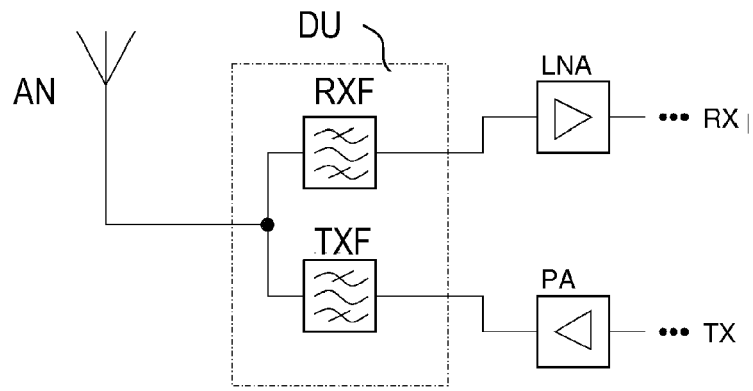
Fig 2
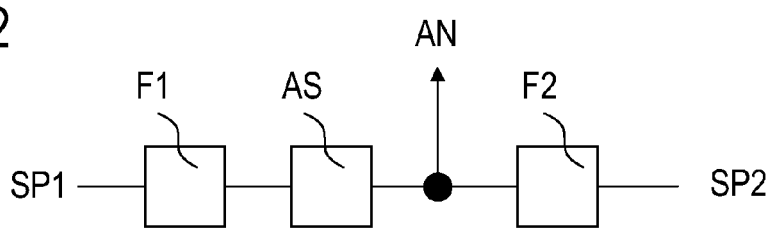
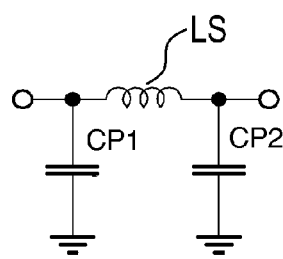
Fig 3A
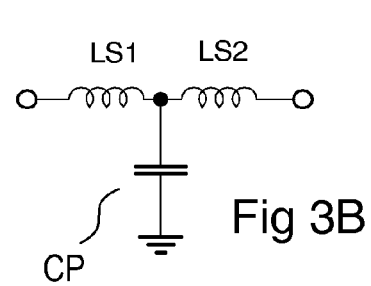
Fig 3B
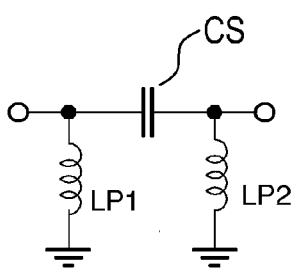
Fig 3C
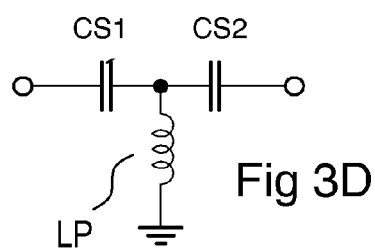
Fig 3D

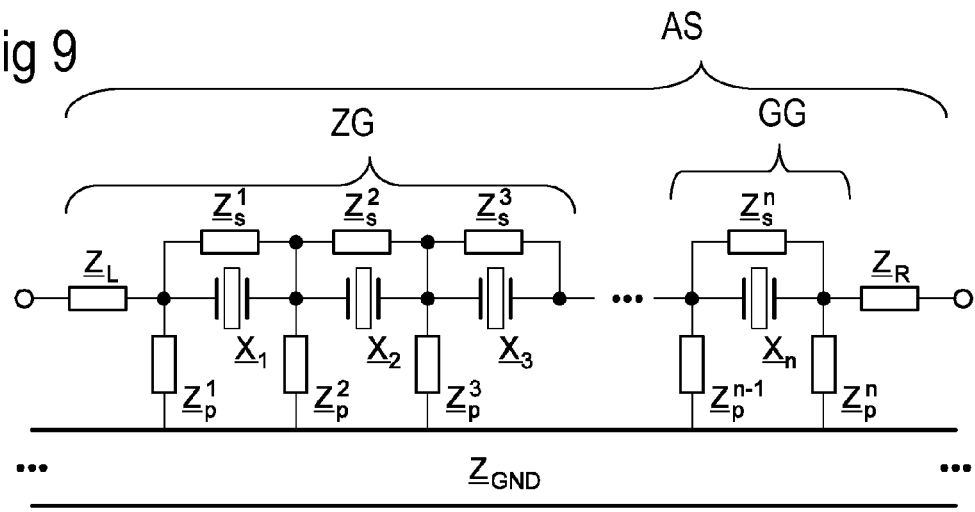
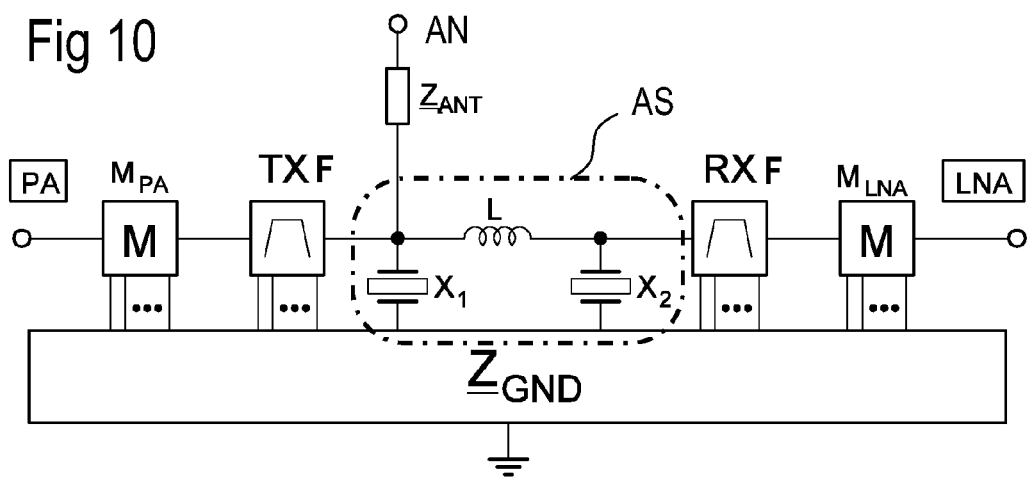
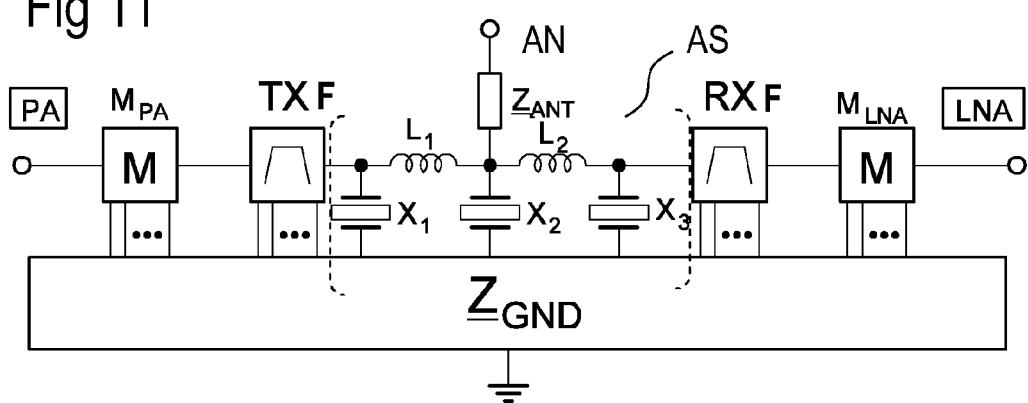

ANTENNA MATCHING CIRCUIT

This application is a continuation of co-pending International Application No. PCT/EP2009/060839, filed Aug. 21, 2009, which designated the United States and was not published in English, and which claims priority to German Application No. 10 2008 045 346.3, filed Sep. 1, 2008, both of which applications are incorporated herein by reference.

BACKGROUND

All $3^{rd}$-generation (3G) mobile radio systems which are relevant for the mass market operate using the (full) frequency duplex mode FDD. That is to say, transmission and reception take place on different frequency channels. The transmission methods which are used in this case are virtually exclusively code division multiple access methods CDMA, which require "real" simultaneous transmission and reception by the telephones and the base stations. By way of example, the mobile radio standards CDMA2000 and W-CDMA (UMTS) in Band II (1.9 GHz) and W-CDMA (UMTS) in Band I (2.1 GHz) may be mentioned here. These are used, inter alia, on the American and European continents.

A frequency duplex mode such as the CDMA method requires duplexers which permanently connect both the transmission path (TX) and the reception path (RX) to the antenna AN, see FIG. 1. The transmission path TX has at least one TX filter TXF or a corresponding filter circuit. The reception path RX has at least one RX filter RXF or a corresponding filter circuit. The main purpose of the duplexer is in this case to isolate the TX path and the RX path from one another. This prevents the transmission power of its PA adversely affecting the sensitivity of the receiver. Furthermore, there must be as little attenuation as possible in the respective paths through the duplexer, in order on the one hand to keep the power consumption by the PA low, and in order on the other hand not to unnecessarily adversely affect the signal-to-noise ratio in the reception path.

Nowadays duplexers for mobile telephones are manufactured virtually exclusively using SAW (surface acoustic wave) or BAW (bulk acoustic wave) technology. Both approaches allow component heights which comply with the requirements of flat terminals and, in both approaches, two individual band pass filters are connected to one antenna node. The two individual filters themselves consist of a plurality of suitably connected resonators. In the case of SAW, there may also be one additional DMS track, a plurality of DMS tracks or exclusively one or more DMS tracks, depending on the design (DMS means dual mode SAW). The resonators and/or DMS tracks are each monolithically integrated, and both filters are manufactured on a common substrate, or else on two different substrates. This results in one single chip or two individual chips which are connected to the duplexer, preferably hermetically shielded, in a housing. Furthermore, it is now normal practice to combine one duplexer together with other duplexers and individual filters in a single module on a ceramic substrate, an FR4 substrate or on any other desired substrate. These filters then in each case share one of a plurality of antenna nodes in groups, or else all together share a single antenna node. A duplexer can be interconnected on a module comprising two individual filters, which are each housed individually. A duplexer is also possibly formed through non-housed chips (bare-die) on a suitable substrate.

Further passive components are required for the functionality and for optimization of the electrical behavior of the duplexer, which components are accommodated on the filter substrate or substrates, in the housing, on the module (FEM) or externally on the board in the telephone. In general, these are inductances, capacitances and line pieces. Resonators and suitable electrical (inductive or capacitive) or magnetic couplings are also normal between elements and nodes in the matching network. Furthermore, the ports PA and LNA, must be matched to the desired filter impedance. In the situation with respect to ground, this is 50 Ohms in virtually all cases, and in this balanced case it is 100 Ohms. Series or parallel inductances are normally used in this case, or else L networks comprising an inductance and capacitance. Specifically in the case of duplexers, it is, finally, necessary at the antenna for both filters to have as high an impedance as possible for all frequencies in the respective other band, and to be matched to the required filter impedance for all frequencies in their own pass band. Ideal matching results in a reflection factor $\Gamma$ of +1 for all frequencies in the other band, and of 0 for all frequencies in their own pass band.

A duplexer consists of a transmission filter and a reception filter. In general, the frequency of the transmission band is lower than that of the reception band. In general, each filter per se is designed such that it is well matched to the antenna port in its own transmission band and is as poorly matched as possible in the respective other band. Each filter then has a pass band in its own band, and a stop band in the other band.

If the two filters were to be connected directly to a common antenna node without any further measures, this then would in general lead to destruction of the pass bands, because of the mutual influence. The reason for this behavior is that, although the condition $|\Gamma|\cong 1$ is satisfied in both cases in the respective other band, the required open circuit $\Gamma\cong +1$ in the other band will be achieved, however, only in exceptional cases. Normally, a problem of this type is solved by connecting each filter to the antenna via a phase shifter $\Phi_{TX}$ or $\Phi_{RX}$.

In this case, the matching curves at the antenna port are each rotated about the center of the Smith chart. In this case, the phase shifters are designed such that the open circuit condition $\Gamma\cong +1$ is deliberately satisfied by the central rotation in the respective other band of each filter. The matching of its own band remains virtually unaffected by this, because the matching curve for the pass band is only rotated about the origin and $|\Gamma|\cong 0$ is still satisfied. In one simple example, only one phase shifter is required on the RX side, that is to say the TX filter is connected directly to the antenna, and the RX filter is connected via a phase shifter. Other options for matching in a duplexer can be used only for special cases, for example for duplexers with a small duplexer separation, and these are otherwise generally associated with other disadvantages.

Three options are known for providing a phase shifter. A first option is to use a delay line (continuous line). A continuous line rotates in the clockwise direction on the Smith chart and can thus be used as a phase shifter. By way of example, a continuous line such as this is described in U.S. Pat. No. 6,262,637 B1.

The phase-shifting behavior of a continuous delay line can also be provided by a discrete line which can be modeled as a circuit similar to a ladder type, comprising a plurality of inductances and capacitances. In the simplest case, three elements connected in a symmetrical π or T arrangement are used to provide a discrete line. This allows a total of four different configurations. Depending on the configuration, a discrete line such as this rotates in the clockwise direction or counterclockwise direction on the Smith chart.

A further option for a phase shifter can be provided by an antenna coil. By way of example, a transmission or reception filter which ends with a series element at the antenna end and has a suitably capacitive effect in its own pass band is sufficient for phase shifting if the antenna connection can be connected directly with a parallel inductance to ground. This results in a phase shifter similar to a discrete line on both sides of the antenna connection.

Instead of a phase shifter, a parallel coil can also be connected to form a series resonator. A further series coil is optionally used for this parallel circuit, and the filter leads to the antenna node via the circuit created in this way. A circuit such as this can be used by one or both filters. It is particularly suitable for a duplexer when the TX band and RX band have a large duplex separation. This has the disadvantage that, if the duplex separation is small, the series coil requires a high inductance value, which cannot be integrated.

SUMMARY

In one aspect, the present invention specifies an antenna matching circuit for a plurality of signal lines, which are connected to a common antenna, for transmission and reception of RF signals, which complies with the current requirements for miniaturization and is suitable for mass production.

An antenna matching circuit is specified which has at least one antenna connection connected to an antenna. At least two signal paths are connected to this antenna connection and each have one pass band either for transmission and/or for reception of RF signals, in particular signal paths for wireless communication and information systems. In order to isolate the signal paths from one another, a matching circuit which comprises a discrete line for phase shifting of a signal in this branch is integrated at the antenna end in at least one of the signal paths. The discrete line is in the form of a circuit which is similar to a ladder type and comprises at least three elements, which are selected from inductances and capacitances. It is now proposed that at least some of the capacitances in this discrete line be provided in the form of micro-acoustic resonators. The resonant frequencies of the resonators are chosen such that their resonances are outside the pass band of the respective signal path. The resonators therefore have a purely capacitive effect in the pass band.

In a small number of special cases, for which the TX filter has been designed to be highly capacitive, the parallel element at the antenna can be omitted in the discrete line. In general, the discrete line consists of at least three elements.

The micro-acoustic resonators may be in the form of SAW or BAW elements. These have the advantage that they may be designed to have a high Q factor. This makes it possible to provide not only the function as a capacitance in the discrete line but additionally pole points in the transfer function which, by suitable positioning, can filter out specific interference frequencies, without additional components being required for this purpose.

However, the micro-acoustic resonators may also be designed using other technologies. The capacitances which are not in the form of micro-acoustic resonators in the discrete line may be in the form of MIM capacitors (MIM=metal isolator metal). Capacitors such as these are particularly advantageous when the signal path contains a filter which has resonators and is formed, for example, from micro-acoustic resonators using ladder-type technology. It is then possible to also integrate the production of the MIM capacitors in the production process for the resonators used for the filters, by using appropriate production steps for deposition of metals or of dielectrics in order to produce the MIM capacitors.

Each of the at least two signal paths may contain filter circuits, at least some of which are provided on a chip. For example, at least a portion of matching circuit can then be provided on this chip, for example, on its surface. It is also possible for the entire filter circuit and the entire matching circuit to be provided on the surface of the chip. One exception is high Q-factor elements, which are in the form of discrete components and are not manufactured integrated with the chip.

The antenna matching circuit may have filter circuits which are provided on a plurality of chips. The capacitances or the micro-acoustic resonators which are used for this purpose in the matching circuit can then likewise be provided on a plurality of chips which support these filter circuits.

However, it is also possible to provide the capacitances for the discrete line or the resonators which are used for this purpose on a separate chip, independently of the filter circuits, and for these to be connected only in the antenna matching circuit.

A π circuit may be provided as a discrete line, having a series capacitance and two inductances in parallel with it. A π circuit comprising a series inductance and two capacitances in parallel with it is also possible.

The discrete line may also be in the form of a T circuit. For this purpose, for example, it has two series capacitances and an inductance in parallel with them. A T circuit is also possible having two series inductances and a capacitance in parallel with them.

A complex impedance can be connected in parallel with each of the micro-acoustic resonators in the antenna matching circuit. In the case of resonators which represent series capacitances in the discrete line, these complex impedances are arranged in a parallel series branch of the signal path. In the case of micro-acoustic resonators which represent parallel capacitances in the discrete line, the complex impedances are arranged in a parallel branch of the matching circuit.

General complex impedances can also be used instead of the inductances.

A complex impedance means at least one impedance element. However, the complex impedance may also be represented by a plurality of impedance elements that are connected. The individual impedance elements in the complex impedance may in this case be formed from capacitances, inductances, resistances and micro-acoustic resonators.

The proposed matching circuit has the advantage that it makes it possible to dispense with a continuous line, which occupies a relatively large amount of space and has relatively high electrical losses. The matching circuit has considerably more degrees of freedom, thus allowing filter circuits at the antenna connection to be matched considerably better, in comparison to a simple antenna coil.

The capacitances in the matching network can be accommodated in a space-saving manner on one or more of the chips which are provided in the antenna matching circuit, in particular, the chips with the filter circuits.

The antenna matching circuit can advantageously be used in a duplexer, wherein a first signal path comprises the transmission path and an appropriate transmission filter, while a second signal path comprises the reception path with an appropriate reception filter. Distribution of the capacitances of the matching network between the chips which contain the transmission filter and the reception filter allows the space consumption of the matching circuit to be balanced out.

The resonances and antiresonances of the capacitances, which are in the form of micro-acoustic resonators, in the matching circuit which comprises a discrete line may be chosen such that pole points can be used for the filter transfer function or for better isolation of the two filters, in particular in a duplexer. On the one hand, the resonances of these pole points can be shifted by combination with further elements which are provided in the matching circuit. In addition, in this case, additional resonances can be forced, in addition to the resonance and antiresonance of the micro-acoustic resonators, producing further pole points which are suitable for improving the transfer function.

The transmission of the (useful) signal in the pass bands of the filters or filter circuits is virtually uninfluenced by these pole points. This ensures that the micro-acoustic resonators act, to a first approximation, solely as high Q-factor static capacitances.

The pole points can be chosen suitably in the stop band of the respective filter circuit such that they improve the isolation of the antenna matching circuit which, for example, comprises a duplexer.

The micro-acoustic resonators in the matching circuit and in particular in the discrete line, as well as all the resonators used in filter circuits, can be "duplicated". Resonators connected in series are cascaded for this purpose. Cascaded means a plurality of resonators connected in series, which resonators, in total, correspond to the characteristics of a resonator which has not been duplicated. This can be done by an appropriate enlargement of the resonator area in the cascaded resonators. Resonators arranged in parallel branches can be "duplicated" by connecting further resonators in parallel. The resonators in this parallel circuit are also designed such that the characteristics of the parallel circuit correspond to those of a single conventional resonator. However, it is also possible, when duplicating resonators, to shift the resonant frequencies with respect to one another within the cascade or the parallel connection. This allows the characteristics to be varied, and this could be used advantageously for the operation of the antenna matching circuit.

Inductances which are necessary for the antenna matching circuit can be formed on the at least one chip, which supports the filter or the filter circuits, in the filter housing, in the duplexer housing, in the module substrate or integrated on the PCB (printed circuit board) which is used for the antenna matching circuit, or externally as discrete element.

In one embodiment, the antenna matching circuit has a discrete line in the form of a π circuit, in which one of the parallel elements is connected directly to the antenna connection. The parallel element may be an inductance or a capacitance, depending on the form of the π circuit.

In a further embodiment of the antenna matching circuit, filter circuits which comprise resonators are provided in the signal paths. The micro-acoustic resonators in the matching circuit can then be designed in the same way as individual resonators in the filter circuit, but differing slightly from them by having an additional layer, an omitted layer, or a layer with a different layer thickness. The micro-acoustic resonators can therefore be formed without any additional process complexity, or with only a small amount of additional process complexity. This also ensures that the resonant frequency of the micro-acoustic resonator is outside the resonant frequency of the resonators used for the filter circuit.

In one embodiment of the antenna matching circuit, filter circuits comprising resonators are provided in both signal paths. All the resonators in the filter circuit and all the resonators in the at least one matching circuit are in this case in the form of BAW resonators (BAW=bulk acoustic wave). The use of a standard technology for the resonators in the filter circuits and the resonators in the matching circuit makes it possible to integrate their production in one process, thus reducing the process complexity. In fact, the additional production of the micro-acoustic resonators for the matching circuit does not increase the complexity, which is required in any case for the production of the resonators for the filter circuits.

An antenna matching circuit which has a signal path with a filter circuit which is intended for reception of RF signals advantageously comprises at least one SAW (=surface acoustic wave) or GBAW (guided bulk acoustic wave) resonator.

It is also possible for the at least two signal paths to have filter circuits and resonators and for all the resonators in the filter circuits to be in the form of SAW resonators. In this case, it is advantageous for the micro-acoustic resonators in the matching circuit, which act as capacitances in the discrete line, to likewise also be provided using SAW technology. A resonator such as this has a resonant frequency which is outside the pass band of the respective filter circuits. This can be achieved by a suitably chosen finger separation between the interdigital transducers which are used in the resonators, such that the resonators have a purely capacitive effect only in the area of the pass bands.

BRIEF DESCRIPTION OF THE DRAWINGS

The invention will be explained in more detail in the following text with reference to exemplary embodiments and the associated figures. The figures are purely schematic and do not claim to completely reflect antenna matching circuits according to the invention, since some of the elements which are relatively unimportant have not been illustrated, for clarity reasons. Furthermore, real filter matching circuits may have further signal paths and, furthermore, further filter circuits, matching circuits or discrete elements in each of the illustrated signal paths.

FIG. 1 shows a known duplexer circuit;
FIG. 2 shows an antenna matching circuit according to the invention;
FIGS. 3A to 3D, collectively
FIG. 3, show various embodiments of discrete lines;
FIG. 5, show various embodiments of bandstop filters;
FIGS. 6A to 6D, collectively
FIG. 9 shows a further variant with discrete lines with parallel-connected series impedances;
FIG. 10 shows an antenna matching circuit with a resonator connected directly to the antenna connection;
FIG. 11 shows an antenna matching circuit in which a discrete line is split equally into two signal branches.

Figure 4:
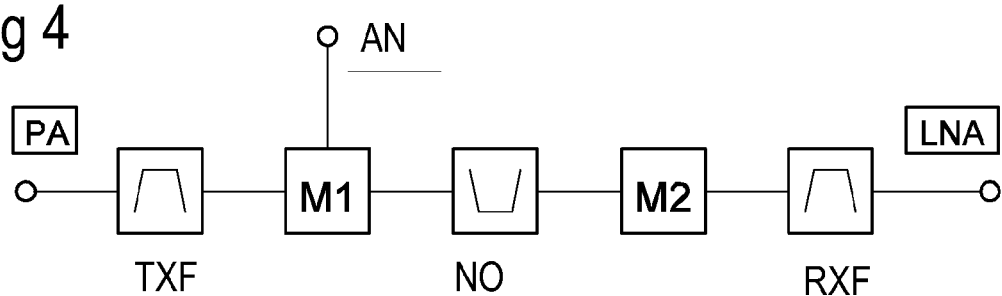
FIG. 4 shows an antenna matching circuit with a notch.

The following list of reference symbols may be used in conjunction with the drawings:
AN Antenna connection
DU Duplexer
TXF Transmission filter
RXF Reception filter PA Power amplifier (in the TX branch)
LNA Low-noise amplifier (in the RX branch)
F1, F2 Filter (circuits)
SP1, SP2 Signal paths
Ls Series inductance
Lp Parallel inductance
Cs Series capacitance
Cp Parallel capacitance
NO Bandstop filter (notch)
M1, M2 Impedance matching circuit
AS Matching circuit with discrete line
X Micro-acoustic resonators
GG Basic element of a discrete line
ZG Additional element of a discrete line
Zs Complex series impedance
Zp Complex parallel impedance
$Z_{GND}$ Complex impedance for ground connection

DETAILED DESCRIPTION OF ILLUSTRATIVE EMBODIMENTS

FIG. 1 schematically illustrates a simple duplexer circuit, in which an antenna connection AN is connected to a transmission path TX and to a reception path RX. A reception filter RXF and an input amplifier LNA are connected in the reception path. A transmission filter TXF and a power amplifier PA are connected in the transmission path TX. The figure does not show a phase shifter element between one of the signal paths and the antenna, which avoids any mutual influence between the two signal paths by appropriate rotation of the signal.

FIG. 2 schematically illustrates one simple embodiment of the antenna matching circuit according to the invention. An antenna connection AN which is connected to an antenna is connected to two signal paths SP1 and SP2. A first filter circuit F1 and a matching circuit AS are connected in series in the first signal path SP1. A second filter circuit F2 is arranged in the second signal path SP2. The matching circuit AS comprises at least one discrete line, in which at least one of the capacitive elements which form the discrete line is in the form of a micro-acoustic resonator.

FIG. 3 shows various options for how a discrete line comprising at least three elements can be illustrated. FIGS. 3A and 3B show discrete lines which rotate positively in the Smith chart, while the discrete lines in FIGS. 3C and 3D rotate negatively. FIGS. 3A and 3C show discrete lines in the form of a π circuit. In FIG. 3A, a series inductance LS is connected in parallel with two capacitances CP1 and CP2, which together form a π element. In FIG. 3C, a series capacitance CS is connected in parallel with two inductances LP1, LP2, which together form a π element. FIGS. 3B and 3D show two discrete lines in the form of a T element. In FIG. 3B, two series-connected series inductances LS1, LS2 are connected via a central node to a parallel capacitance CP. In FIG. 3D, two series-connected series capacitances CS1, CS2 are connected via a node arranged between them to a parallel inductance LP. A 180 to 360° rotation on the Smith chart is possible with each of these discrete lines. In contrast to a continuous line, which is not the subject matter of the invention, a discrete line can be designed to rotate negatively, as mentioned. In this case, the rotation takes place in the counterclockwise direction on the Smith chart.

The discrete lines illustrated in FIG. 3 may have any desired number of further elements added to them, in which case each element may be a series or parallel element, chosen to be a capacitance or an inductance.

FIG. 4 shows an antenna matching circuit in which an antenna is connected to a transmission path TX and a reception path RX via an antenna connection AN. The antenna connection AN is arranged within a first impedance matching circuit M1. A transmission filter TXF is arranged in the transmission path, while a bandstop filter NO (also referred to as notch) is connected in series in the reception path, in series with a second impedance matching circuit M2 and a reception filter RXF. The appropriate amplifier circuits PA and LNA are arranged at the end of the respective signal paths.

In this embodiment, the two impedance circuits and the bandstop filter are designed such that they produce a phase shift like a discrete line. At the same time, the impedance circuits provide matching between the TX filter and the bandstop filter at the antenna, and between the bandstop filter and the RX filter.

FIG. 5 shows various options for how a bandstop filter can be provided in the embodiment illustrated by way of example in FIG. 4. The respective bandstop filter NO may in this case be arranged in at least one of the signal paths, and in one embodiment even in both signal paths, independently of the other components. The bandstop filter is preferably arranged close to the antenna connection.

Figure 5A:
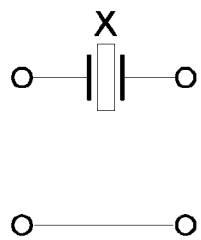
FIGS. 5A to 5E, collectively

In FIG. 5A, the bandstop filter comprises a single micro-acoustic resonator X in the signal path. A balanced second signal line, or alternatively a ground path, is arranged in parallel with this.

Figure 5B:
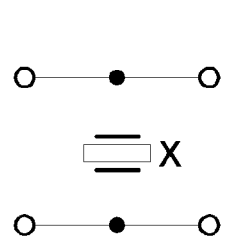

FIG. 5B shows a bandstop filter NO, which comprises a parallel resonator X, which checks the two signal paths in parallel.

Figure 5C:
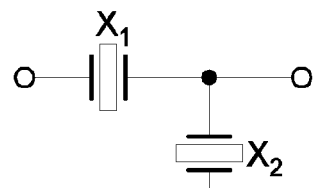

FIG. 5C shows a bandstop filter NO, which comprises a series resonator $X_1$ and a parallel resonator $X_2$.

Figure 5D:
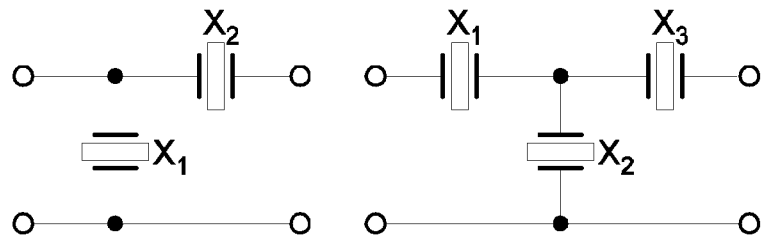
Figure 5E:
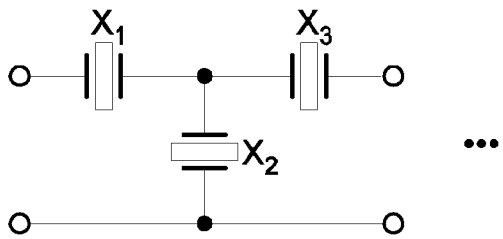

FIG. 5D shows an arrangement which is mirror-image symmetrical with respect to FIG. 5C. FIG. 5E shows a bandstop filter which consists of two series resonators $X_1$ and $X_3$ and a resonator $X_2$ in parallel with them. In addition, the bandstop filters illustrated in FIGS. 5A to 5E may have any desired number of further elements, and in particular further resonators, added to them. A bandstop filter effect is obtained by appropriate arrangement of the resonant and antiresonant frequencies of the resonators. The frequency of the bandstop filters is, for example, arranged in the area of the antiresonance of a series resonator, or in the area of the resonance of a parallel resonator. If series and parallel resonators are used in a bandstop filter NO, then the corresponding series antiresonance and the parallel series resonance match or are closely adjacent. In general, the bandstop filter may be formed from a plurality of micro-acoustic resonators in a ladder-type circuit, which, from the antenna end, start either with a series resonator or a parallel resonator. A bandstop filter need not consist of an integer number of elements, in each case consisting of one series and one parallel micro-acoustic resonator, but may also comprise individual resonators. The number of elements in a bandstop filter is not limited.

Figure 6:
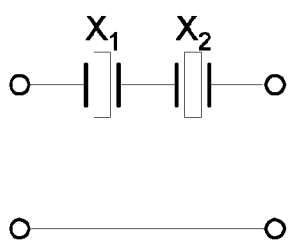
FIG. 6, show various options for "duplication" of series and parallel resonators.
Figure 6:
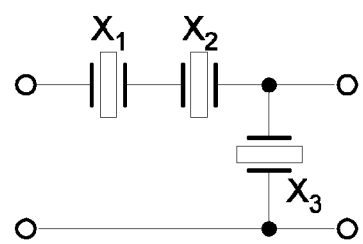
Figure 6:
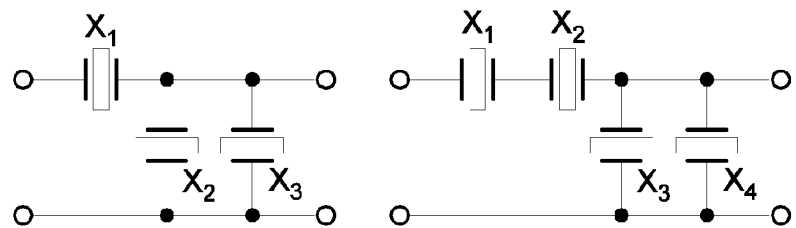

FIG. 6 shows various options for how resonators of filter circuits or resonators of bandstop filters or of resonators which are used as capacitances in discrete lines can be "duplicated". FIG. 6A shows a duplicated series resonator which in this case comprises a cascade of two series-connected micro-acoustic resonators $X_1$ and $X_2$. In FIG. 6B, a further micro-acoustic resonator $X_3$ has been added to this arrangement, connected in parallel with it. FIG. 6C shows a basic element of a bandstop filter, of a filter circuit or a discrete line, in which a first series resonator $X_1$ and two resonators $X_2$, $X_3$ in parallel with it are connected. The two parallel resonators are directly adjacent in the circuit. FIG. 6D shows a further variation of FIG. 6C, in which the series resonator $X_1$ is also duplicated. Two parallel series resonators $X_1$, $X_2$ are connected in parallel with two resonators $X_3$, $X_4$.

Figure 7:
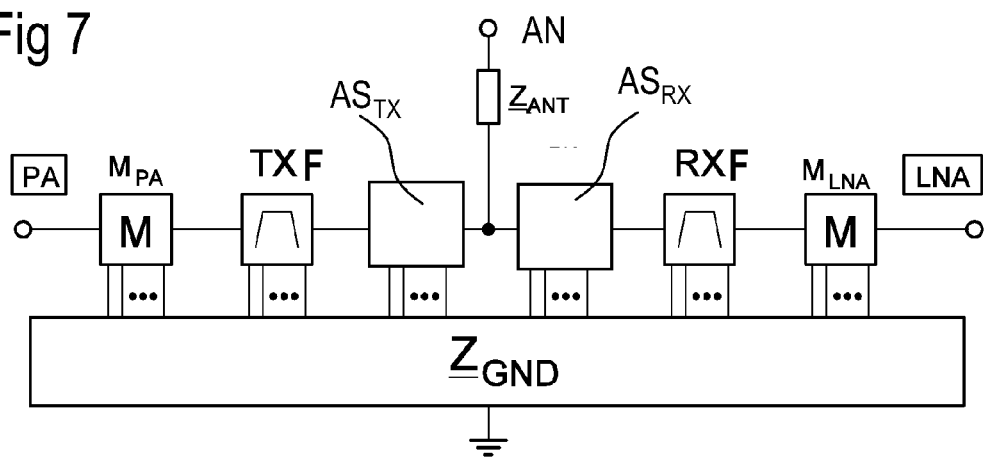
FIG. 7 shows an antenna matching circuit with multistage matching.

FIG. 7 shows an antenna matching circuit with multistage matching, as a further embodiment of the invention. This comprises a dedicated matching circuit $AS_{TX}$ and $AS_{Rx}$, which each comprise a discrete line, in each of the two signal paths RX, TX. The two matching circuits are connected directly to the antenna connection, and are thus arranged at the antenna end in each signal path. The discrete line contained in each of the matching circuits $AS_{TX}$ and $AS_{Rx}$ comprises capacitances in the form of micro-acoustic resonators, with the discrete lines having structures as illustrated in FIG. 3. Some of the capacitances which are required for the discrete lines may also be replaced as a metal-dielectric-metal structure with a predominantly capacitive effect.

Furthermore, each of the signal paths contains a corresponding filter or a corresponding filter circuit TX, RX, which each have a pass band. The signal path is matched to the respective amplifier PA or LNA via a further impedance matching circuit $M_{LNA}$, $M_{PA}$.

The ground connections of all the components in the signal paths, specifically those of the impedance matching circuits, of the filter circuits and of the matching circuits, together form a multiport complex impedance $Z_{GND}$, which may contain any desired elements, electrical connections between these elements, and electrical and magnetic couplings between the elements. The multiport complex impedances $Z_{GND}$ may also contain micro-acoustic resonators.

The impedance matching circuits $M_{PA}$ and $M_{LNA}$ are optional, and may be omitted if required. The antenna AN is fed via a complex two-pole network $Z_{ANT}$, which may contain any desired passive elements. In the simplest case, $Z_{ANT}$ is a feed line with impedance.

Figure 8:
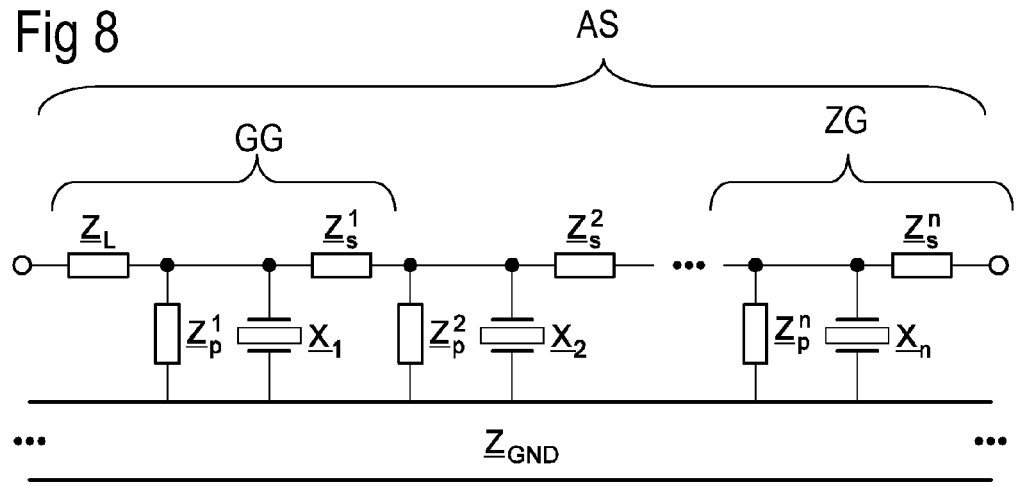
FIG. 8 shows one variant of a discrete line with parallel-connected impedances.

FIG. 8 shows discrete lines designed according to the invention, as can be used in the matching circuits AS or the impedance matching circuits M, for example in FIG. 7. The illustrated discrete lines are variations of the discrete lines illustrated in FIGS. 3A and 3B. In FIG. 7, all the parallel capacitances have been replaced by micro-acoustic resonators $X_1$, $X_2$ to $X_n$. A general complex impedance $Z_p^1$, $Z_p^2$ to $Z_p^n$ is connected in parallel with in each case one of the micro-acoustic resonators. The cross-connection of the parallel branches to the micro-acoustic resonators and the complex impedances in parallel with them is provided by general complex impedances $Z_L$, $Z_S^1$, $Z_S^2$ to $Z_S^n$, when all the ground connections of the parallel elements are made via a multiport complex impedance $Z_{GND}$. In this case as well, the complex impedances may contain further micro-acoustic resonators. The matching circuit AS comprises at least one basic element GG, as is shown in more detail in the figure, and any desired number of additional elements ZG, which are connected appropriately to the basic element GG.

FIG. 9 shows a discrete line designed according to the invention, as is illustrated in principle in FIGS. 3C and 3D and which in each case rotate negatively on the Smith chart. In this embodiment, all the series capacitances in the discrete line have been replaced by micro-acoustic resonators $X_1$ to $X_n$, each of which has a respective general complex impedance $Z_S^1$ to $Z_S^n$ connected in parallel with it.

The general complex impedances $Z_L$ and $Z_R$ are provided at the ends of the signal paths remote from the antenna connection, or at the ports. The complex impedances $Z_p^1$, $Z_p^2$ to $Z_p^n$ are arranged in parallel branches, which are each connected to ground via nodes upstream and/or downstream of the series elements. The ground connection of the parallel branches is made via the general multiport impedance $Z_{GND}$. The complex impedances which are illustrated here may also comprise further micro-acoustic resonators.

FIG. 10 shows an embodiment of an antenna matching circuit according to the invention in which the discrete line is in the form of a simple π element of a type as illustrated in FIG. 3A. The transmission filter TXF is connected to the antenna connection AN without a matching network. The reception filter RXF, in contrast, is linked to the antenna AN via a discrete line in the form of a CLC circuit in a π form, wherein the capacitances in this π element are in the form of micro-acoustic resonators $X_1$ and $X_2$. The π element in this case acts as a phase shifter.

An antenna matching circuit as illustrated here represents a duplexer such as that which a Band II duplexer may contain.

The micro-acoustic resonators $X_1$ and $X_2$ may be provided on a chip, on which the filter circuit of the transmission filter or of the reception filter is also provided. It is also possible to place the micro-acoustic resonators of the discrete line on two separate chips, to which the respective filter circuits for RX and TX filters are fitted. In one embodiment, the transmission filter TXF is linked to the antenna AN via a series resonator which is part of the filter circuit. In a further embodiment, the reception filter RXF starts with a series resonator at its end facing the antenna AN. In a further embodiment, at least one of the impedance matching circuits at the ports $M_{PA}$ and $M_{LNA}$ or else the antenna impedance $Z_{ANT}$ is or are in the form of a series inductance.

In one embodiment, the micro-acoustic resonator of the π element is in the form of a series or parallel resonator comprising the filter circuit of the transmission filter TXF. In order to shift its resonant frequency, the parallel micro-acoustic resonator in the π element may also additionally have a ground plane on its upper electrode, in order to reduce the resonant frequency of this resonator and to move it out of the pass band of the TX filter. The micro-acoustic resonator $X_2$ may likewise be designed in the same way as a series or parallel resonator for the transmission filter TXF.

However, the micro-acoustic resonator $X_2$ may also be designed in the same way as a parallel resonator for the RX filter while $X_1$ can be designed as a parallel resonator for the transmission filter TXF.

In addition, the parallel micro-acoustic resonator $X_2$ of the π element may also have an additional ground plane, in order to reduce the resonant frequency and to move it out of the pass band of the transmission or reception filter.

The impedance matching circuits M at the ends of the signal paths remote from the antennas, which ensure the matching to the respective amplifiers PA and LNA, are optional and may also be omitted. They are not required for the duplexer function itself.

In various embodiments of duplexers, it may be possible to carry out matching for the duplexer both on the transmission path side and on the reception path side, in order to ensure the operation of the duplexer. This can then be done using a π element which is arranged on both sides of the antenna node, in which case the parallel micro-acoustic resonator $X_2$ which is in each case on the antenna side is common to the π elements. By way of example, FIG. 11 illustrates an arrangement such as this. In addition, the antenna matching circuit illustrated in FIG. 11 is the same as or similar to that illustrated in FIG. 10. In this case as well, the micro-acoustic resonators in the matching circuit AS may be provided on one or more chips on which at least some of the filter circuits for the transmission filter TXF or the reception filter RXF are also provided. At least one of the impedance matching circuits M arranged at the ends of the signal paths remote from the antenna, or the antenna matching inductance $Z_{ANT}$, is or are in the form of a series inductance.

Figure 12:
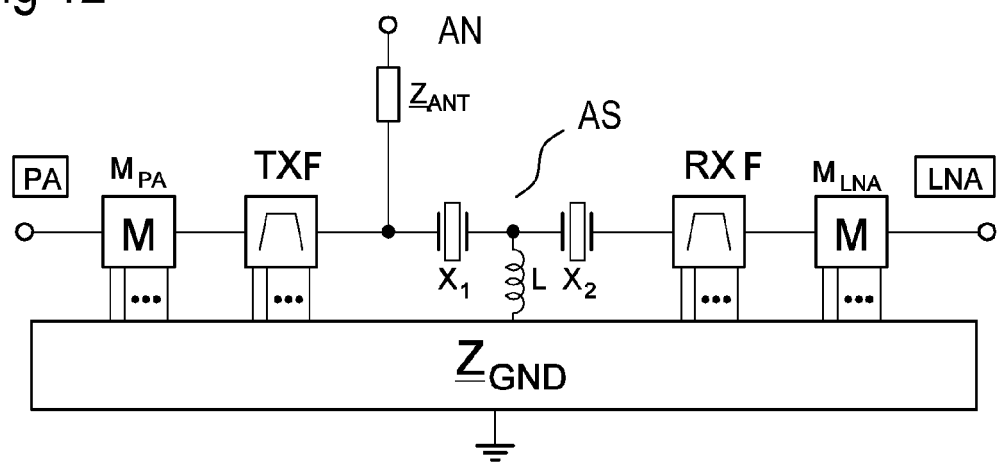
FIG. 12 shows an antenna matching circuit with a discrete line in one signal path.

In a modified version of the antenna matching circuit shown in FIG. 10, the matching circuit AS in FIG. 12 is in the form of a T element consisting of two series micro-acoustic resonators $X_1$ and $X_2$ as well as a parallel inductance L arranged between them. The same variation options as those which have already been explained with reference to the embodiments in FIGS. 10 and 11, in which a discrete line in the form of a π element is provided as a matching circuit, apply for the integration of the micro-acoustic resonators in the discrete line and the choice of the corresponding resonant frequencies.

Figure 13:
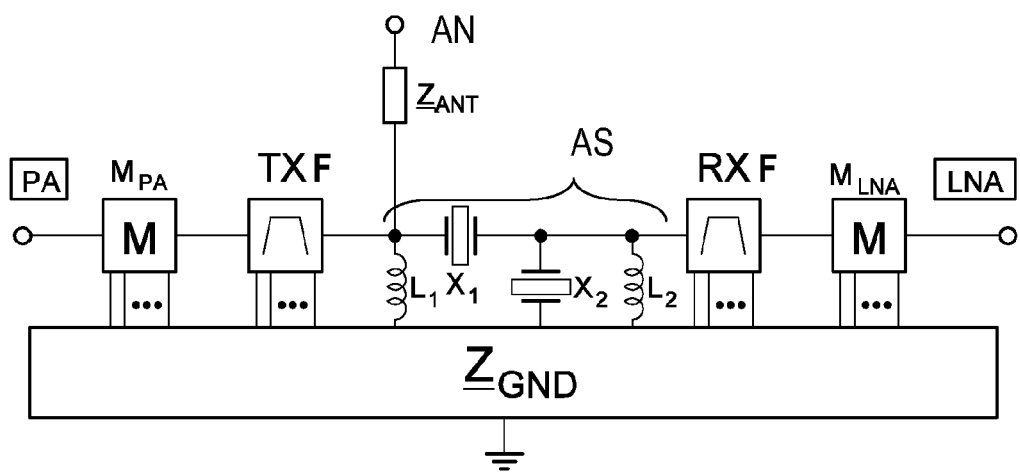
FIG. 13 shows a further variant of an antenna matching circuit.

FIG. 13 shows a further embodiment of an antenna matching circuit, in which the matching circuit AS is in the form of a discrete line of the negatively rotating type (similar to the type illustrated in FIG. 3C). In this case, the transmission filter TXF is connected directly to the antenna, without a matching circuit or phase shifter. In contrast, the reception filter RXF is in the form of a π element, via an LCL, in which the series capacitance is in the form of a micro-acoustic resonator $X_1$. In order to ensure that the parallel inductance $L_2$ is small and can be implemented on a chip, for example, in a simple manner, an additional parallel resonator $X_2$ is used, and is connected in parallel with the inductance $L_2$ of the π element. The resonator $X_2$ may also be in the form of a micro-acoustic resonator, and may be of the same type as the resonator $X_1$. One typical application for the circuit described here is a Band II duplexer.

The filter circuits of the transmission and reception filters for the described duplexers are preferably formed from resonators. By way of example, all the resonators in the filter circuits may be BAW resonators. At least one resonator in the reception filter RXF may be a SAW resonator. At least one resonator in the reception filter can likewise also be a GBAW resonator (GBAW=guided bulk acoustic wave). In a further variant, all the resonators in the transmission and reception filters, but not the micro-acoustic resonators in the discrete line and the impedance matching circuits, are in the form of SAW resonators. The micro-acoustic resonators, which represent the capacitances in the discrete line, are preferably provided as BAW resonators. However, it is also possible for all the resonators in the filter circuits of the duplexer, in the same way as those in the matching circuit and the discrete line contained therein, to be in the form of SAW resonators. It is also possible for all the resonators in the filter circuits of the duplexer to be in the form of GBAW resonators, while the resonators in the matching circuit are, in contrast, in the form of BAW resonators. In a further embodiment, all the resonators in the duplexer and those in the matching circuit are in the form of GBAW resonators.

Figure 14:
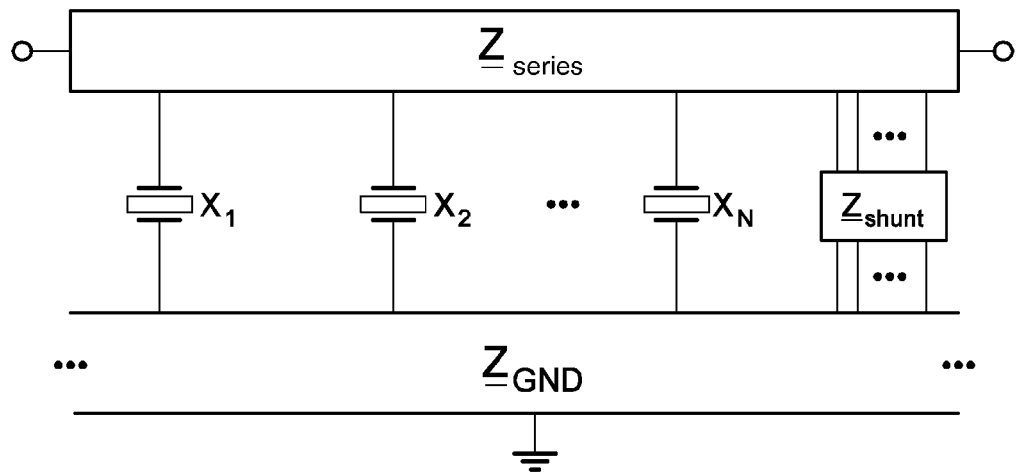
FIG. 14 shows a generalized illustration of a discrete line of the positively rotating type, to which additional impedance elements have been added.

FIG. 14 shows a generalized option for providing a discrete line, as used according to the invention in a matching circuit, of the type illustrated in FIGS. 3A and B. All the parallel capacitances in the discrete line, which comprises a plurality of elements, have been replaced by the micro-acoustic resonators $X_1$ to X. The cross-connection in the series branch, that is to say in the signal line, is made by the general, complex, multiport impedance $Z_{series}$, while the ground connection of the parallel branches is made by the general multiport impedance $Z_{GND}$. The connection between the complex impedance $Z_{series}$ and $Z_{GND}$ is made via the complex impedance $Z_{shunt}$ which may then, for example, also comprise impedances which are each connected in parallel with individual resonators. Each of the complex impedances may contain further micro-acoustic resonators.

Figure 15:
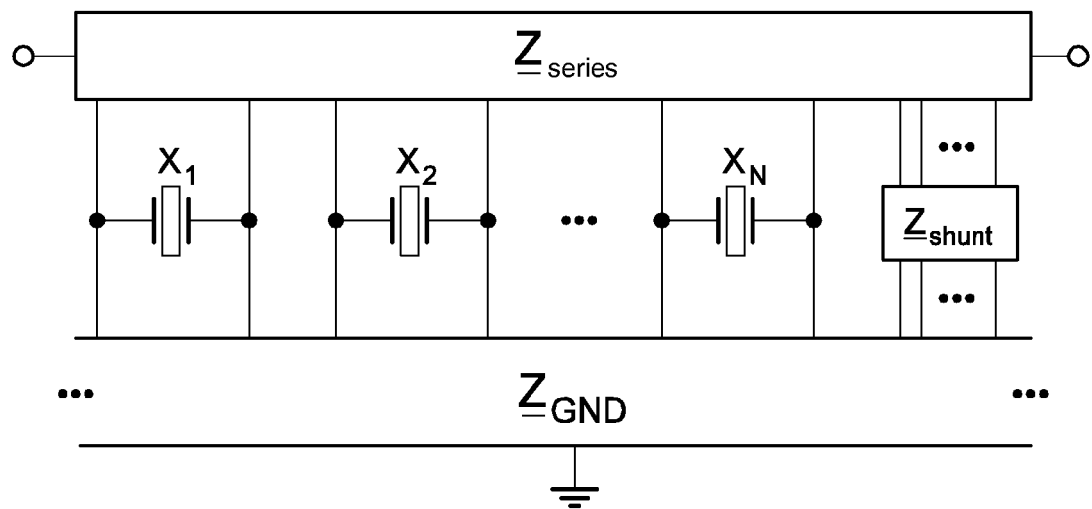
FIG. 15 shows a generalized illustration of a discrete line of the negatively rotating type, to which additional impedance elements have been added.

In a corresponding manner, a discrete line, as used according to the invention in a matching circuit of the type as illustrated in FIGS. 3C and 3D, is generalized in a corresponding manner in FIG. 15. Here, all the series capacitances are replaced by micro-acoustic resonators $X_1$, $X_2$ to X. The cross-connection is made by the general complex multiport impedance $Z_{series}$, while the ground supply is provided by the general multiport complex impedance $Z_{GND}$. The connection between $Z_{series}$ and $Z_{GND}$ is made by the general multiport complex impedance $Z_{shunt}$. All of the complex impedances may contain further resonators.

The generalizations illustrated in FIGS. 14 and 15 take account of the option of adding to the basic types of discrete lines and any desired impedance elements as shown in FIG. 3, which in the end can be combined to form the complex multiport impedances. However, one of the basic elements illustrated in FIG. 3 is provided in each of these two embodiments, with at least one of the capacitances in each case being provided by a micro-acoustic resonator.

Figure 16:
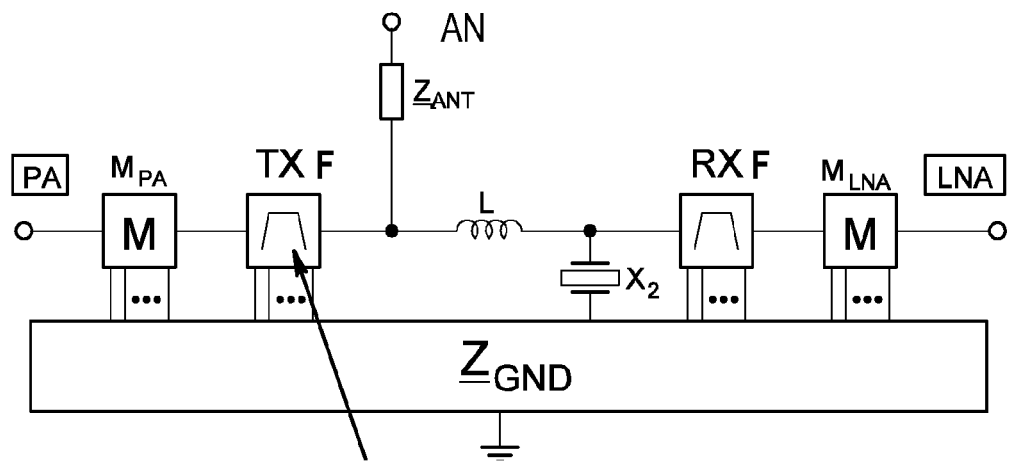
FIG. 16 shows a simplified form of FIG. 10, in which the TX filter has been designed to be capacitive.
Figure 17:
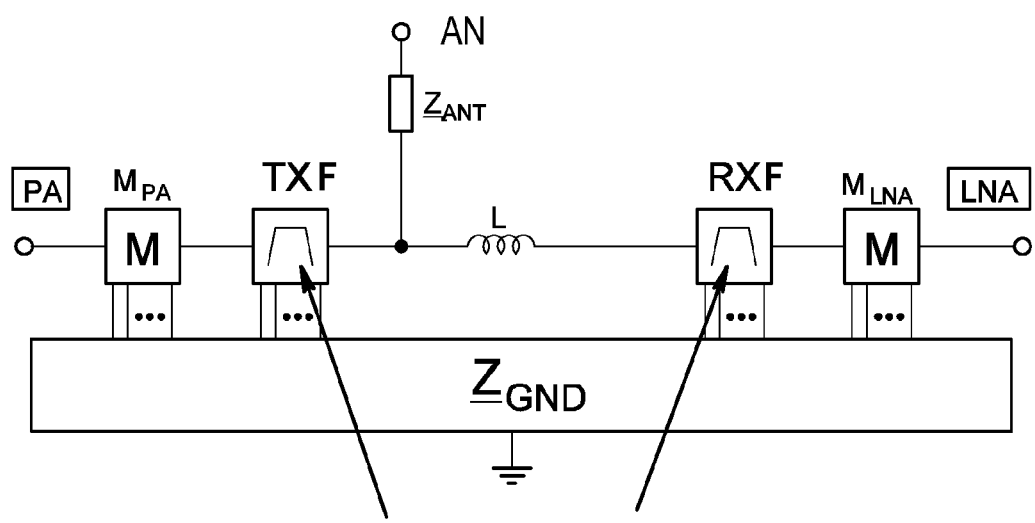
FIG. 17 shows a simplified form of FIG. 10, in which the TX filter and RX filter have been designed to be capacitive.

FIGS. 16 and 17 show a simplification of FIG. 10. In this case, either the TX filter (FIG. 16) and/or the RX filter (both filters in FIG. 16) are/is of capacitive design. This makes it possible to dispense with the parallel micro-acoustic resonators $X_1$ and/or $X_2$ on the antenna side for the discrete line. In the simplest case, both filters are connected only via an inductance. The filters which have been set to be capacitive are indicated by an arrow.

The antenna matching circuit according to the invention is not restricted to the described embodiments which are described specifically in the exemplary embodiments or the figures. The invention may be restricted to the stated basic elements or may be added to by any desired further elements in the signal paths or in the antenna path. The antenna matching circuit can not only be used for duplexers but also allows the connection of any desired number of signal paths which can be used for transmission or reception to one antenna, in particular to form a multiplexer.

What is claimed is:

1. An antenna matching circuit comprising:
   an antenna connection to be connected to an antenna;
   at least two signal paths coupled to the antenna connection, each of the at least two signal paths having one pass band for transmission and/or reception of an RF signal;
   a matching circuit comprising a discrete line for phase shifting of the RF signal in a segment of each of the at least two signal paths integrated at an antenna end, wherein the matching circuit is configured to perform an impedance transformation, wherein the discrete line forms a π circuit that comprises a serial inductance and parallel capacitances, wherein the parallel capacitances comprise micro-acoustic resonators whose resonance is outside the pass band of one of the at least two signal paths; and
   filter circuits in the at least two signal paths, wherein the filter circuits comprise filter resonators, wherein all the resonators in the filter circuits and all the micro-acoustic resonators in the matching circuit are disposed on a common chip, wherein the micro-acoustic resonators in the matching circuit have a design based on the design of the resonators in the filter circuits, and wherein at least one of the filter resonators and at least one of the micro-acoustic resonators are cascaded.

2. The circuit according to claim 1, wherein the micro-acoustic resonators are in the form of SAW or BAW components.

3. The circuit according to claim 1, wherein some of the parallel capacitances are in the form of MIM capacitors.

4. The circuit according to claim 1, wherein all of the matching circuit is disposed on the common chip.

5. The circuit according to claim 1, wherein the discrete line comprises a T circuit with two series inductances and a parallel capacitance between the series inductances.

6. The circuit according to claim 1, wherein a complex impedance is connected in parallel with each of the micro-acoustic resonators, the complex impedances being arranged in a parallel series branch of the signal path for resonators which represent series capacitances, and are arranged in a parallel branch of the matching circuit for resonators which represent parallel capacitances.

7. The circuit according to claim 1, wherein one of the parallel capacitances is connected directly to the antenna connection.

8. The circuit according to claim 1, wherein all the filter resonators and all the micro-acoustic resonators are BAW resonators.

9. The circuit according to claim 1, wherein one signal path of the at least two signal paths has a first filter circuit for reception of RF signals, the first filter circuit being one of the filter circuits and comprising at least one SAW or GBAW resonator.

10. The circuit according to claim 1, wherein all the filter resonators are SAW resonators.

11. The circuit according to claim 1,
wherein one or more of the parallel capacitances comprises a capacitance filter which is capacitive and is or are connected to the same node in one of the at least two signal paths.

12. The circuit according to claim 1, wherein the micro-acoustic resonators in the matching circuit have the same design as the filter resonators in the filter circuits.

13. The circuit according to claim 1, wherein the micro-acoustic resonators in the matching circuit are slightly modified with respect to the filter resonators in the filter circuits.

14. The circuit according to claim 1, wherein the micro-acoustic resonators in the matching circuit are modified with respect to the filter resonators in the filter circuits by an additional layer, an omitted layer, or a layer with a different layer thickness.

15. The circuit according to claim 1, further comprising an antenna coupled to the antenna connection.

16. The circuit according to claim 1, wherein additional resonances are forced to produce further pole points, wherein the additional resonances are in addition to a resonance and anti-resonance of the micro-acoustic resonators.

17. The circuit according to claim 1, further comprising creating additional pole points outside the pass band of the one of the at least two signal paths in a stop band of the other of the at least two signal paths.

18. The circuit according to claim 17, wherein resonances of the pole points are shifted by combination with further elements of the matching circuit.

19. An antenna matching circuit comprising:
an antenna connection to be connected to an antenna;
at least two signal paths coupled to the antenna connection, each of the at least two signal paths having one pass band for transmission and/or reception of an RF signal;
a matching circuit comprising a discrete line for phase shifting of the RF signal in a segment of one of the at least two signal paths integrated at an antenna end in at least one of the at least two signal paths, wherein the matching circuit is configured to perform an impedance transformation, wherein the discrete line is in the form of a π circuit that comprises a serial capacitance and parallel inductances, and a parallel capacitance, wherein the capacitances comprise micro-acoustic resonators whose resonance is outside the pass band of the at least one of the at least two signal paths; and
filter circuits in the at least two signal paths, wherein the filter circuits comprise resonators, wherein all the resonators in the filter circuits and all the micro-acoustic resonators in the matching circuit are disposed on a common chip, wherein the micro-acoustic resonators in the matching circuit have a design based on the design of the resonators in the filter circuits, and wherein at least one of the resonators of one of the filter circuits and at least one micro-acoustic resonator of the matching circuit are cascaded.

20. The circuit according to claim 19, further comprising creating additional pole points outside the pass band of the one of the at least two signal paths in a stop band of the other of the at least two signal paths.

21. The circuit according to claim 20, wherein resonances of the pole points are shifted by combination with further elements of the matching circuit.

\* \* \* \* \*

UNITED STATES PATENT AND TRADEMARK OFFICE
CERTIFICATE OF CORRECTION

PATENT NO.        : 9,214,920 B2                               Page 1 of 1
APPLICATION NO.   : 13/024943
DATED             : December 15, 2015
INVENTOR(S)       : Andreas Link It is certified that error appears in the above-identified patent and that said Letters Patent is hereby corrected as shown below:

Claims

In Col. 14, line 22, claim 19, delete "a it circuit" and insert --a π circuit--.

Signed and Sealed this
Fifteenth Day of March, 2016

Michelle K. Lee
*Director of the United States Patent and Trademark Office*